(12) United States Patent
Bae

(10) Patent No.: US 8,507,184 B2
(45) Date of Patent: Aug. 13, 2013

(54) METHOD OF MANUFACTURING SEMICONDUCTOR DEVICE

(75) Inventor: Sang Man Bae, Seoul (KR)

(73) Assignee: SK hynix Inc., Icheon-si (KR)

( * ) Notice: Subject to any disclaimer, the term of this patent is extended or adjusted under 35 U.S.C. 154(b) by 1050 days.

(21) Appl. No.: 12/147,745

(22) Filed: Jun. 27, 2008

(65) Prior Publication Data

US 2009/0286185 A1    Nov. 19, 2009

(30) Foreign Application Priority Data

May 16, 2008   (KR) .................. 10-2008-0045813

(51) Int. Cl.
*G03F 7/26*    (2006.01)
*G03F 7/20*    (2006.01)

(52) U.S. Cl.
USPC ..................... 430/312; 430/311; 430/394

(58) Field of Classification Search
USPC ........................... 430/311, 312, 394
See application file for complete search history.

(56) References Cited

U.S. PATENT DOCUMENTS

| 6,204,187 | B1 * | 3/2001 | Rupp et al. | 438/702 |
| 6,245,685 | B1 * | 6/2001 | Sung et al. | 438/719 |
| 7,005,235 | B2 * | 2/2006 | Lin | 430/311 |

FOREIGN PATENT DOCUMENTS

KR    10-2007-0074757    7/2007

* cited by examiner

*Primary Examiner* — Kathleen Duda
(74) *Attorney, Agent, or Firm* — Marshall, Gerstein & Borun LLP

(57) ABSTRACT

Disclosed herein is a method of manufacturing a semiconductor device that includes: performing a first exposure process with a first exposure mask having a first space pattern formed in a first direction; performing a second exposure process with a second exposure mask different from the first exposure mask, the second exposure mask having a second space pattern formed in a second direction intersected with the first direction; and forming a contact hole by a developing process.

12 Claims, 7 Drawing Sheets

(1)

(2)

METHOD OF MANUFACTURING SEMICONDUCTOR DEVICE

CROSS-REFERENCE TO RELATED APPLICATION

The present application claims the benefit of Korean patent application number 10-2008-0045813, filed on May 16, 2008, which is incorporated herein by reference in its entirety.

BACKGROUND OF THE INVENTION

The invention relates to a method of manufacturing a semiconductor device, and more particularly, to a method of manufacturing a semiconductor device having contact holes with various shapes.

As a pattern size becomes smaller due to the increase of semiconductor integration, it becomes more difficult to etch a fine pattern on a wafer.

Generally, etching of a semiconductor wafer is performed by projecting at ¼ or ⅕ of an exposure mask pattern size, so that, a predetermined pattern formed in a photoresist film coated on a wafer cannot be obtained accurately due to light diffraction.

Particularly, the diffraction phenomenon of exposure light sources becomes worse as a contact hole of a semiconductor device becomes smaller. Thus it is difficult to obtain a slit type contact hole pattern from the exposure mask using the photoresist film to form the wafer.

As shown in FIG. 1, when a contact hole pattern, which is designed to be square on the exposure mask, is exposed over the wafer, a circular contact hole 2, having the same length in the lengths of the X and Y axes, may be formed on a circuit pattern 1. However, as the size of the contact hole becomes smaller, the contrast of exposure light is degraded and, after development, the profile of a photoresist pattern may deteriorate. As a result, a desired contact hole cannot be obtained.

As the contact hole pattern becomes smaller, the portion of the contact hole which is to be connected to the circuit pattern also becomes smaller. As a result, it is preferable to not form a circular contact hole, but rather to form a contact hole pattern having an improved contact margin toward a major axis direction of the circuit pattern. In this way, the portion connected to the circuit pattern may be formed to be broader.

When the contact hole pattern is designed to have a length difference of the contact hole between the lengths in the X and Y axes by broadening the contact margin of the contact hole pattern toward the major axis direction of the circuit pattern, a diffraction phenomenon according to the X and Y axes is differentiated depending on the length difference between the lengths in the X and Y axes. As a result, the influence on the profile of the photoresist pattern is complicated so that it is difficult to obtain a desired contact hole pattern on the wafer.

Also, a difference in contrast causes a difference in speed to develop toward the X and Y axes directions. If a developing target is set toward one of the X and Y axes directions, an undesired contact hole pattern is obtained by using a different developing speed for the other axis.

Since the photoresist film formed on the wafer is exposed with the same energy, it is easy to obtain a contact hole pattern having the same length both in the lengths along the X and Y axes. In the case of the square pattern that improves a margin for overlapping between the contact hole pattern and the circuit pattern, due to the diffraction phenomenon, it is difficult to form the desired square pattern. In order to form the square pattern, various optical proximity corrections are used.

As a result, it is difficult to improve the margin needed to overlap the contact hole toward the major axis direction of the circuit pattern. As the pattern becomes smaller, the overlapped region between the circuit pattern and the contact hole pattern is reduced. Thus, the quality of the semiconductor device is degraded.

BRIEF SUMMARY OF THE INVENTION

Various embodiments of the invention are directed to providing a method of manufacturing a semiconductor device having contact holes with various shapes.

According to an embodiment of the invention, a method of manufacturing a semiconductor device may comprise performing first exposing the semiconductor device with a first exposure mask having a first space pattern formed in a first direction; second exposing the semiconductor device with a second exposure mask, the second exposure mask having a second space pattern formed in a second direction intersected with the first direction; and forming a contact hole by a developing process.

The first exposing may performed with a first exposure energy and the second exposing may performed with a second exposure energy.

The first exposure mask may include a binary mask or a phase shift mask.

The second exposure mask may include a binary mask or a phase shift mask.

After performing the exposure process, the method may the further comprise exposing the semiconductor device a plurality of times with a plurality of exposure masks.

According to an embodiment of the invention, a method of manufacturing a semiconductor device may comprise forming a hard mask layer over a semiconductor substrate having an underlying layer; first photo-etching on a first photoresist film coated on the hard mask layer with a first exposure mask having a first space pattern formed in a first direction to form a first photoresist pattern; etching the hard mask layer with the first photoresist pattern as a first etching mask to form a hard mask pattern; second photo-etching on a second photoresist film coated over the resulting structure having the hard mask pattern with a second exposure mask different from the first exposure mask, the second exposure mask having a second space pattern formed in a second direction intersected with the first direction; and etching the underlying layer with the second photoresist pattern and the hard mask pattern, as a second etching mask to form a contact hole.

The first photoresist film may have a different gamma (γ) value from that of the second photoresist film.

The first photo-etching using the first exposure mask may use a first exposure energy and the second photo-etching using the second exposure mask may use a second exposure energy.

The first photo-etching using the first exposure mask may use a first developing speed and the second photo-etching using the second exposure mask may use a second developing speed.

The first exposure mask may include a binary mask or a phase shift mask.

The second exposure mask may include a binary mask or a phase shift mask.

According to an embodiment of the invention, a method of manufacturing a semiconductor device may comprise forming a plurality of hard mask layers on a semiconductor substrate having an underlying layer; repeatedly photo-etching the hard mask layers with a plurality of exposure masks to form a plurality of hard mask patterns; and etching the underlying layer with the hard mask patterns as an etching mask to form a contact hole.

DESCRIPTION OF EMBODIMENTS

Figure 1:
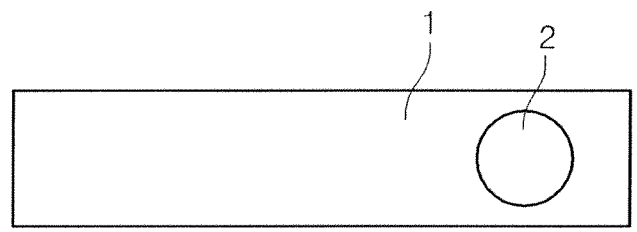
FIG. 1 shows a diagram illustrating a conventional contact hole pattern.
Figure 2:
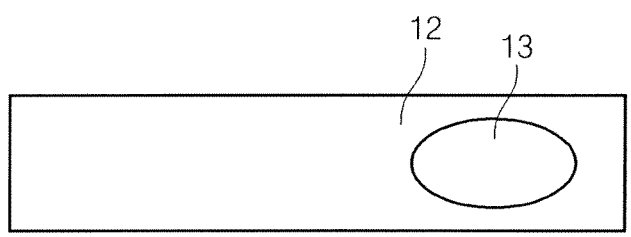
FIG. 2 shows a plane diagram illustrating a contact hole according to an embodiment of the invention.
Figure 3:
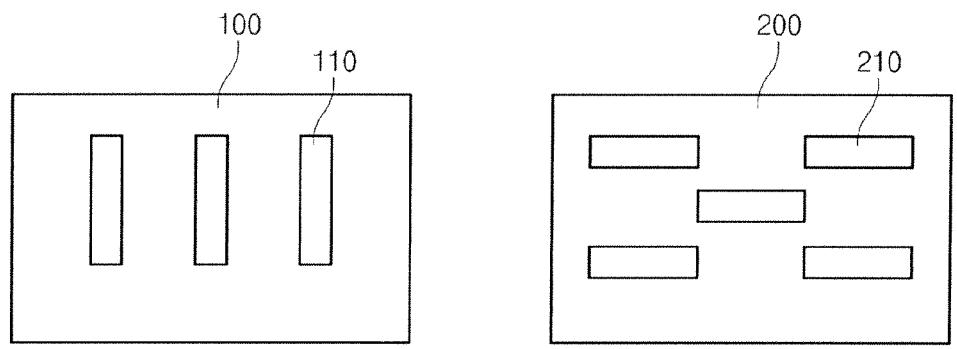
FIG. 3 shows a plane diagram illustrating first and second exposure masks according to an embodiment of the invention.

FIG. 2 shows a plane diagram illustrating a contact hole according to an embodiment of the invention, and FIG. 3 shows a plane diagram illustrating a first and a second exposure mask according to an embodiment of the invention.

Referring to FIG. 2, a contact hole 13 having an improved margin may be formed on a circuit pattern 12.

Referring to FIG. 3, a first exposure mask 100 may have a space pattern 110 formed in a first direction, and a second exposure mask 200 may have a space pattern 210 formed in a second direction intersected with the first direction, such as an X-axis and a Y-axis direction.

The space patterns 110 and 210 may be formed to have a bar type pattern as shown in FIG. 3, however, other patterns may also be used with embodiments of the invention.

It may not necessary to cross the first direction of the first space pattern 110 of the first exposure mask 100 with the second direction of the second space pattern 210 of the second exposure mask 200 at right angles. Instead, they may be intersected at various angles to obtain various shapes of the contact hole.

In order to manufacture an embodiment of the semiconductor device produced by the invention, a double exposure process and a double patterning process may be performed using the first exposure mask 100 with the second exposure mask 200, wherein the second exposure mask 200 is different from the first exposure mask 100. However, the invention is not limited to using two masks to form the various shapes of the contact hole, but the process may be performed using two or more masks.

The first exposure mask 100 and the second exposure mask 200 include a binary mask and a phase shift mask, respectively. Embodiments of the invention may use other types of masks.

The phase shift mask may be formed to have an optical phase difference of 180°, such as a halftone phase shift mask, a chromeless phase shift mask, or a rim type phase shift mask to improve resolution and depth of focus.

Figure 4:
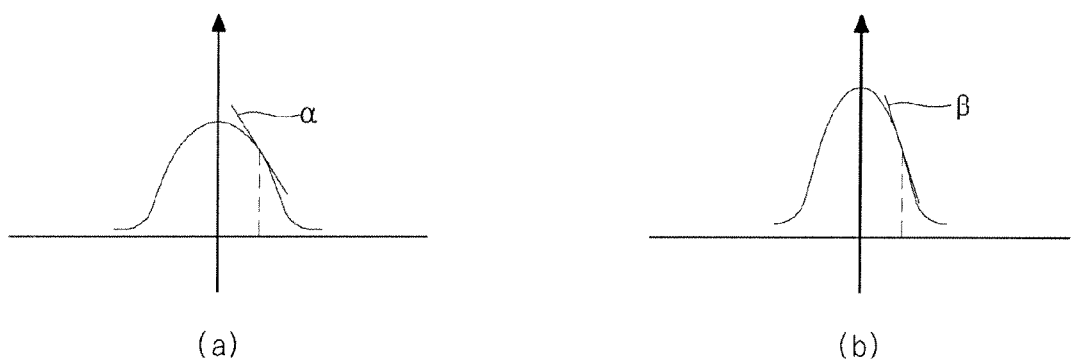
FIG. 4 shows diagrams illustrating a contrast slope depending on the kind of exposure mask used according to an embodiment of the invention.

FIG. 4 shows diagrams illustrating a contrast slope depending on the kind of exposure mask used according to an embodiment of the invention.

α of FIG. 4 represents a contrast slope of a binary mask, and β of FIG. 4 represents a contrast slope of a phase shift mask. The contrast slope represents a degree of diffraction of an exposure light. For example, as the slope becomes larger, the diffraction degree becomes smaller.

In the case of a phase shift mask, the patterning of interface surfaces may be excellent due to a larger value of the contrast slope and a smaller diffraction degree in comparison with the binary mask, so that it may be possible to obtain a pattern in a region having a smaller process margin.

More specifically, in a region having a smaller process margin, that is, in a minor axis direction of a circuit pattern where a contact hole may be formed, an exposure process may be performed with the phase shift mask having a smaller diffraction degree since the contrast slope may be larger to form the same minor axis width of the space pattern. On the other hand, in a region having a larger process margin, that is, in a major axis direction of the circuit pattern where a contact hole may be formed, an exposure process may be performed with a space pattern of the binary mask having a larger diffraction degree since the contrast slope may be smaller to form a larger contact margin with the contact hole. As a result, a desired contact hole may be obtained.

Hereinafter, an embodiment of a method of forming an oval contact hole by a double exposure process is described. The first exposure mask 100 may be a binary mask, and the second exposure mask 200 may be a phase shift mask.

Figure 5A:
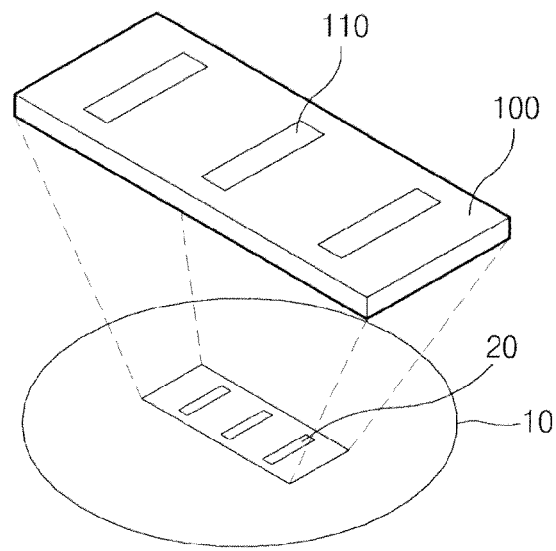
FIGS. 5a to 5c show diagrams illustrating a method of forming a contact hole of a semiconductor device according to an embodiment of the invention.
Figure 5B:
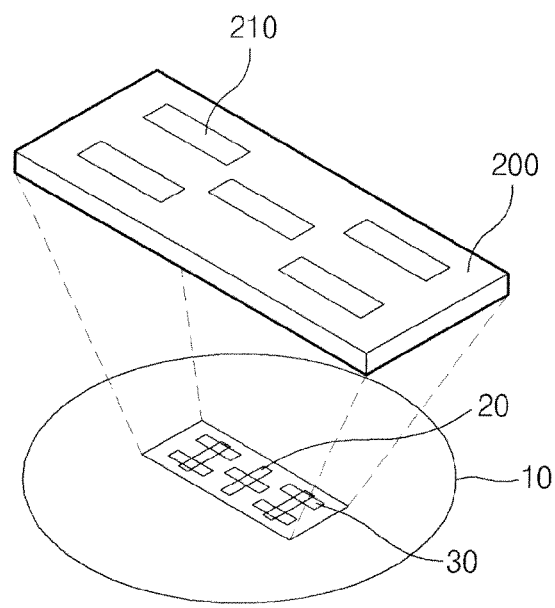
Figure 5C:
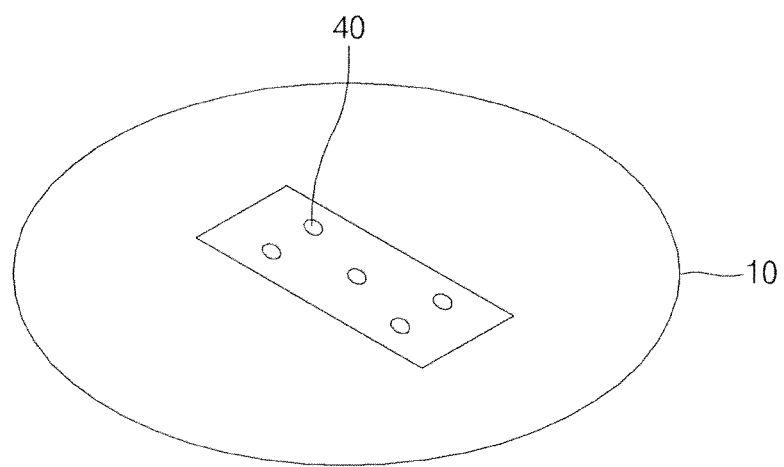

FIGS. 5a to 5c show diagrams illustrating a method of forming a contact hole of a semiconductor device according to an embodiment of the invention.

A first exposure process (see FIG. 5a) may use the first exposure mask 100 and the second exposure process (see FIG. 5b) may use the second exposure mask 200, which is different from the first exposure mask 100, to overlap space patterns 20 and 30.

A region where the space patterns 20 and 30 are overlapped may not be embodied on a wafer because the region may be exposed with an exposure energy of less than a given limit point.

Using an embodiment of the disclosed developing process (see FIG. 5c), a contact hole pattern 40 may be formed. Specifically, the oval contact hole pattern 40 may be formed on the wafer 10, that is, in a double exposed region where the space pattern 20 formed using the first mask 100 and the space pattern 30 formed using the second mask 200 may be overlapped.

A different exposure energy may be applied to each process through the double exposure process including the first exposure process and the second exposure process. As a result, the suitable exposure energy may be applied to the first or second direction depending on mask patterns so as to use the process margin sufficiently, thereby obtaining the oval contact hole 40 depending on sizes of each axis.

Also, a developing speed may be applied to the process, thereby improving the margin of the contact hole.

Hereinafter, an embodiment of a method of forming an oval contact hole by a double patterning process is described. The first exposure mask 100 may be a binary mask, and the second exposure mask 200 may be a phase shift mask.

FIGS. 6a to 6e show diagrams illustrating a method of forming a contact hole of a semiconductor device according to another embodiment of the invention.

Figure 6A:
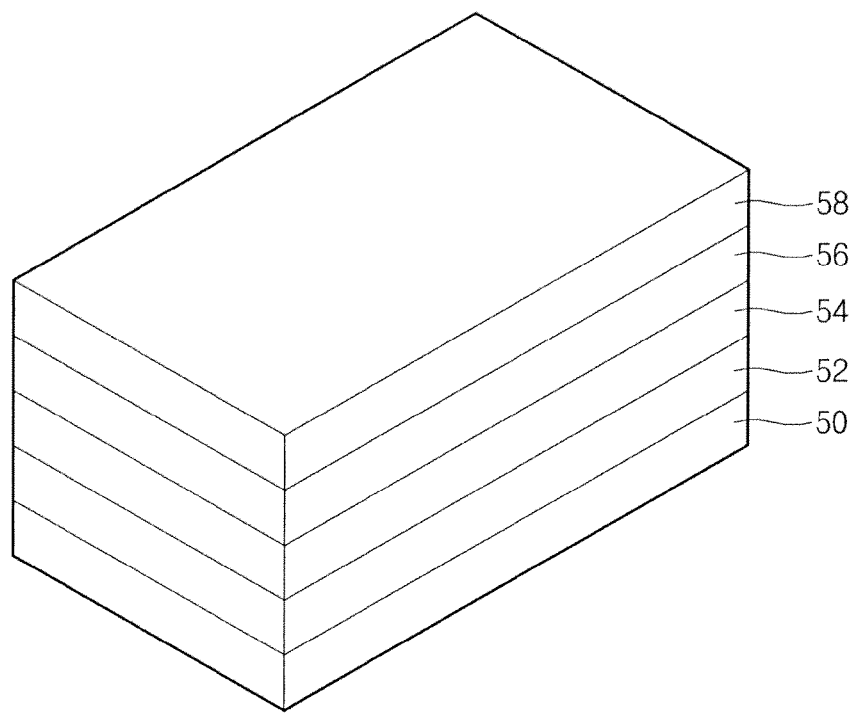
FIGS. 6a to 6e show diagrams illustrating a method of forming a contact hole of a semiconductor device according to another embodiment of the invention.

Referring to FIG. 6a, a first hard mask layer 54 and a second hard mask layer 56 which may have a different etching selectivity may be formed on a semiconductor substrate 50 having an underlying layer 52. A first photoresist film 58 may be coated over the resulting structure.

Figure 6B:
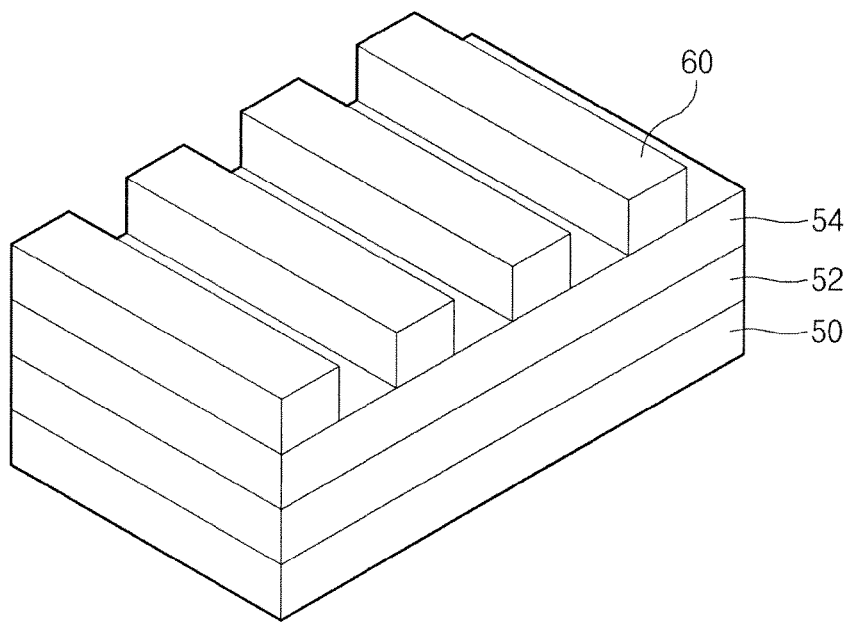

Referring to FIG. 6b, the first photoresist film 58 may be exposed and developed with the first exposure mask 100 to etch the second hard mask layer 56, thereby obtaining a second hard mask pattern 60.

Figure 6C:
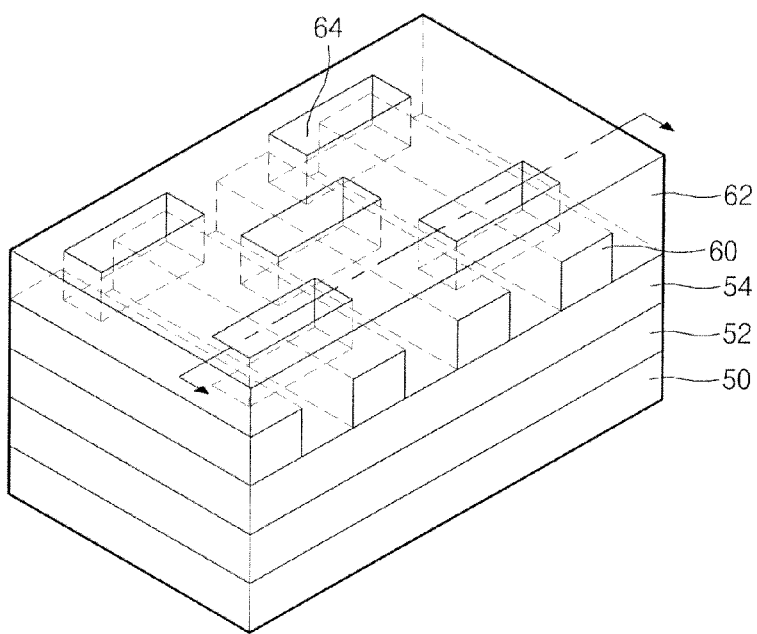
Figure 6C:
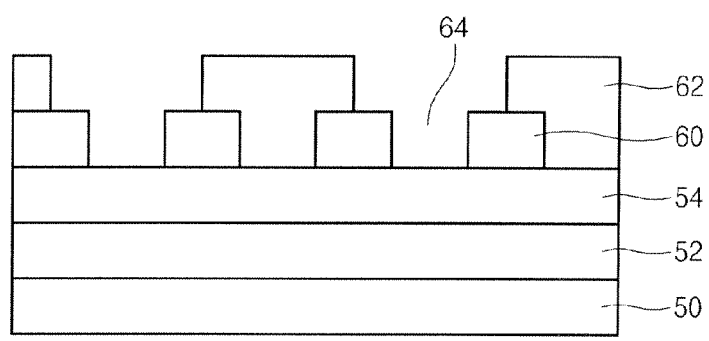

Referring to FIG. 6c(1), a second photoresist film 62 may be coated on the second hard mask pattern 60. The second photoresist film 62 may be exposed and developed with the second exposure mask 200 to form a photoresist pattern 64.

The second photoresist film 62 may have a different gamma (γ) value from that of the first photoresist film 58, so that the second photoresist film 62 reacts different from the first photoresist film 58 depending on a baking time, a developing time and an exposing time.

FIG. 6c(2) shows a cross-sectional diagram of FIG. 6c(1).

Figure 6D:
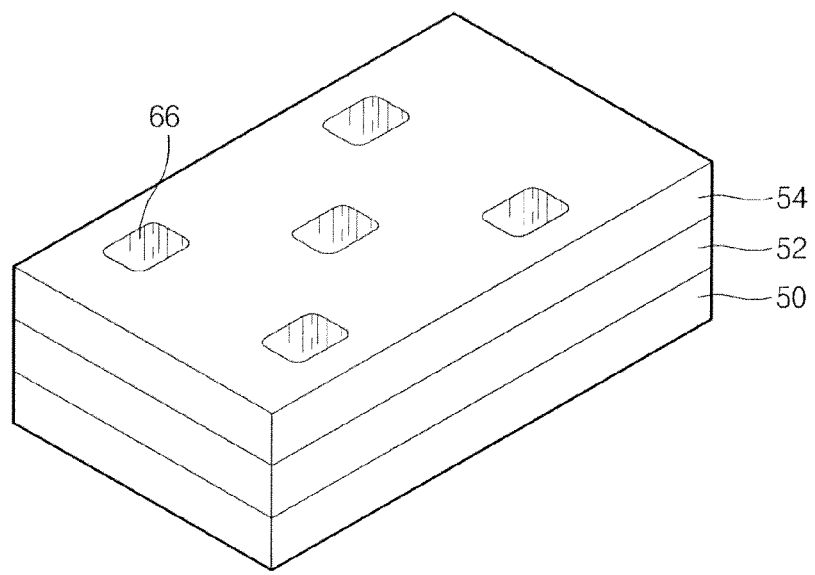

Referring to FIG. 6d, the first hard mask layer 54 may be etched with the second photoresist pattern 64 and the second hard mask pattern 60 as an etching mask to form a first hard mask pattern 66 for forming a contact hole.

Figure 6E:
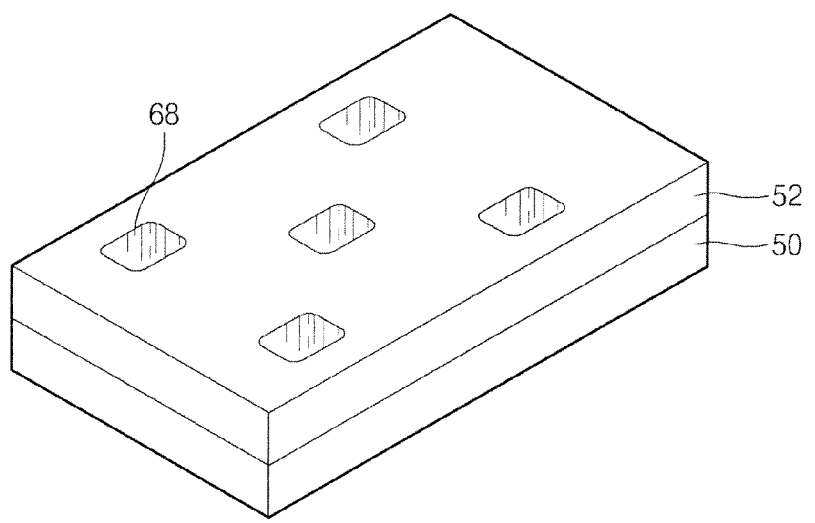

Referring to FIG. 6e, the underlying layer 52 may be etched with the first hard mask pattern 66 as an etching mask to form a contact hole 68.

In another embodiment of the invention, a contact hole having various shapes may be formed using three or more exposure masks.

At least one or more of the three or more exposure masks may be different from each other.

An overlapping angle of the pattern formed in each exposure mask may be adjusted by the method of forming a contact hole using three or more exposure masks, so that the contact hole may have various shapes depending on overlapped types of the pattern.

A specific process may be performed by a person having ordinary skill in the art with reference to the above-described embodiments of the invention, so that the process may not be further explained with respect to the aspects known to a person of ordinary skill in the art.

The above-described embodiments of the invention are illustrative and not limiting. Various alternatives and equivalents are possible. The embodiments of the invention are not limited by the type of depositing, etching, polishing, and patterning procedures describe herein. Nor are embodiments of the invention limited to any specific type of semiconductor device. For example, embodiments of the invention may be implemented to form a dynamic random access memory (DRAM) device or non volatile memory device. Other additions, subtractions, or modifications may be inherent in view of the disclosure including the background and are intended to fall within the scope of the claims.

What is claimed is:

1. A method of manufacturing a semiconductor device, the method comprising:
    first exposing a semiconductor device with a first exposure mask having a first space pattern formed in a first direction;
    second exposing the semiconductor device with a second exposure mask, the second exposure mask having a second space pattern formed in a second direction intersecting with the first direction; and
    forming a contact hole by a developing process,
    wherein the first direction is a minor axis direction of a circuit pattern where the contact hole is formed and the second direction is a major axis direction of the circuit pattern, and
    wherein a contrast slope of the first exposure mask is larger than a contrast slope of the second exposure mask, such that a degree of diffraction of the first exposure mask is less than a degree of diffraction of the second exposure mask.

2. The method according to claim 1, comprising performing the first exposing with a first exposure energy and performing the second exposing with a second exposure energy.

3. The method according to claim 1, wherein the first exposure mask includes a binary mask or a phase shift mask.

4. The method according to claim 3, wherein the second exposure mask is a binary mask when the first mask is a phase shift mask and the second exposure mask is a phase shift mask when the first mask is a binary mask.

5. The method according to claim 1, further comprising exposing the semiconductor device a plurality of times with a plurality of exposure masks.

6. A method of manufacturing a semiconductor device, the method comprising:
    forming a hard mask layer over a semiconductor substrate having an underlying layer;
    first photo-etching on a first photoresist film coated on the hard mask layer with a first exposure mask having a first space pattern formed in a first direction to form a first photoresist pattern;
    etching the hard mask layer with the first photoresist pattern as a first etching mask to form a hard mask pattern;
    second photo-etching on a second photoresist film coated over the resulting structure having the hard mask pattern with a second exposure mask different from the first exposure mask, the second exposure mask having a second space pattern formed in a second direction intersected with the first direction; and
    etching the underlying layer with the second photoresist pattern and the hard mask pattern, as a second etching mask to form a contact hole,
    wherein the first direction is a minor axis direction of a circuit pattern where the contact hole is formed and the second direction is a major axis direction of the circuit pattern, and
    wherein a contrast slope of the first exposure mask is larger than a contrast slope of the second exposure mask, such that a degree of diffraction of the first exposure mask is less than a degree of diffraction of the second exposure mask.

7. The method according to claim 6, wherein the first photoresist film has a different gamma (γ) value from a gamma value of the second photoresist film.

8. The method according to claim 6, wherein the first photo-etching using the first exposure mask uses a first exposure energy and the second photo-etching using the second exposure mask uses a second exposure energy.

9. The method according to claim 6, wherein the first photo-etching using the first exposure mask uses a first developing speed and the second photo-etching using the second exposure mask uses a second developing speed.

10. The method according to claim 6, wherein the first exposure mask includes a binary mask or a phase shift mask.

11. The method according to claim 10, wherein the second exposure mask is a binary mask when the first mask is a phase shift mask and the second exposure mask is a phase shift mask when the first mask is a binary mask.

12. A method of manufacturing a semiconductor device, the method comprising:
    forming a plurality of hard mask layers on a semiconductor substrate having an underlying layer;
    repeatedly photo-etching the hard mask layers with a plurality of exposure masks to form a plurality of hard mask patterns; and etching the underlying layer with the hard mask patterns as an etching mask to form a contact hole, wherein at least one of the plurality of exposure masks has a first space pattern formed in a minor axis direction of a circuit pattern where the contact hole is formed and at least one of the other exposure masks has a second space pattern formed in a major axis direction of the circuit pattern, and wherein a contrast slope of the mask having a first space pattern is larger than a contrast slope of the mask having a second space pattern, such that a degree of diffraction of the first exposure mask is less than a degree of diffraction of the second exposure mask.

* * * * *